United States Patent [19]
Miyauchi et al.

[11] Patent Number: 5,436,497
[45] Date of Patent: Jul. 25, 1995

[54] SEMICONDUCTOR DEVICE HAVING A PLURALITY OF VERTICAL TYPE TRANSISTORS HAVING NON-INTERSECTING INTERCONNECTIONS

[75] Inventors: Masato Miyauchi; Hiroya Sato, both of Tenri, Japan

[73] Assignee: Sharp Kabushiki Kaisha, Osaka, Japan

[21] Appl. No.: 121,498

[22] Filed: Sep. 16, 1993

[30] Foreign Application Priority Data

Sep. 18, 1992 [JP] Japan .................. 4-249398

[51] Int. Cl.6 .............. H01L 29/40; H01L 29/44; H01L 29/73
[52] U.S. Cl. .................. 257/587; 257/584; 257/197; 257/778; 257/737
[58] Field of Search ............ 257/700, 737, 766, 584, 257/587, 588, 202, 586, 203, 205, 208, 778, 738, 781, 197, 198

[56] References Cited

U.S. PATENT DOCUMENTS

| 4,268,849 | 5/1981 | Gray et al. ................ 257/766 |
| 4,807,021 | 2/1989 | Okumura ................ 257/738 |
| 5,296,733 | 3/1994 | Kusano et al. ............ 257/587 |

FOREIGN PATENT DOCUMENTS

| 0476971 | 3/1992 | European Pat. Off. ...... 257/700 |
| 58-95855 | 6/1983 | Japan ..................... 257/202 |
| 0150884 | 7/1987 | Japan ..................... 257/584 |
| 3-3335 | 1/1991 | Japan . |

OTHER PUBLICATIONS

*IEEE Transactions on Microwave Theory and Techniques*, vol. 38, No. 10, Oct. 1990, Wang et al.: "Ultrahigh Power Efficiency Operation of Common-Emitter and Common-Base HBT's at 10 GHz," pp. 1381–1388.
*GaAs IC Symposium*, pp. 271–274, Bayraktaroglu et al.: "Monolithic X-Band Heterojunction Bipolar Transistor Power Amplifiers".

*Primary Examiner*—Robert P. Limanek
*Assistant Examiner*—Wael M. Fahmy
*Attorney, Agent, or Firm*—Nixon & Vanderhye

[57] ABSTRACT

A semiconductor device is disclosed. The semiconductor device include: a semiconductor substrate; a plurality of vertical type construction transistors, each of the transistors including; a semiconductor multilayer formed on the semiconductor substrate, the semiconductor multilayer including at least an emitter layer, a collector layer, and a base layer; first, second, and third electrodes, the first electrode being electrically connected to the base layer, the second electrode being electrically connected to one of the emitter layer and the collector layer, the third electrode being formed on the semiconductor multilayer, and being electrically connected to the other of the emitter layer and the collector layer; a first interconnection, formed on the semiconductor substrate, for electrically connecting a plurality of the first electrodes to each other; a second interconnection, formed on the semiconductor substrate in a non-intersecting relationship with the first interconnection, for electrically connecting a plurality of the second electrodes to each other; and a plurality of bump electrodes configured to receive a third interconnection for electrically connecting the plurality of bump electrodes to each other, each of the plurality of bump electrodes being formed on a respective one of the third electrodes.

13 Claims, 9 Drawing Sheets

SEMICONDUCTOR DEVICE HAVING A PLURALITY OF VERTICAL TYPE TRANSISTORS HAVING NON-INTERSECTING INTERCONNECTIONS

BACKGROUND OF THE INVENTION

1. Field of the Invention

The present invention relates to a semiconductor device in which a plurality of vertical type construction transistors such as heterojunction bipolar transistors (HBTs) are included in one and the same substrate.

2. Description of the Related Art

Progress has been made in the epitaxial growth technique for making a semiconductor layer of Group III–V compounds, so that a heterojunction can be formed with high accuracy. Due to the progress in such a technique, a vertical type construction transistor with a heterojunction such as a heterojunction bipolar transistor (HBT) or a hot electron transistor has been actively and widely studied. In addition, an integrated circuit including such vertical type construction transistors has been actively and widely studied.

In general, in a semiconductor device in which a plurality of transistors are included in one and the same substrate, it is necessary to connect the transistors to each other. In FIG. 6, a vertical type construction transistor 4 includes an emitter electrode 1, a base electrode 2 and a collector electrode 3. In order to connect the vertical type construction transistor 4 to other transistors adjacent thereto (not shown), an emitter interconnection 11, a base interconnection 12, and a collector interconnection 13 are provided for the electrodes 1, 2, and 3, respectively, as is shown in FIG. 6. Depending on the arrangement of the adjacent transistors, two of the three interconnections 11, 12, and 13 are required to intersect with each other. In this specification, intersection of two interconnections means that two interconnections formed on the same support cross with each other. FIG. 6 shows an exemplary structure in which the emitter interconnection 11 intersects with the collector interconnection 13 in an intersecting portion P. FIG. 7A is an enlarged plan view of the intersecting portion P shown in FIG. 6. FIG. 7B is a cross-sectional view of the intersecting portion P. In order to prevent the emitter interconnection 11 and the collector interconnection 13 both formed on a substrate 25 from being electrically in contact with each other, in the intersecting portion P, the collector interconnection 13 overlaps the emitter interconnection 11 with an insulating film 20 interposed there-between.

With the above structure, a parasitic capacitance is generated in the intersecting portion P due to the insulating film 20 formed between the two interconnections 11 and 13. There arises a problem in that the parasitic capacitance degrades the transistor characteristics. However, if the electrode area of the intersecting portion P is minimized in order to reduce the parasitic capacitance as a countermeasure against the above problem, this disadvantageously produces a parasitic resistance. The parasitic resistance also degrades the transistor characteristics. Especially in a vertical type construction transistor which operates at a high speed and a high frequency, it is a critical problem to reduce the parasitic capacitance and the parasitic resistance for enhancing the device characteristics.

Another conventional structure for reducing the parasitic capacitance in the intersecting portion P is shown in FIGS. 8A and 8B. In the shown conventional structure, a collector interconnection 13 spatially overlaps an emitter interconnection 11 so as to intersect with no insulating film interposed therebetween. This conventional structure which is referred to as an air-bridge structure is suitable for reducing the parasitic capacitance.

As is shown in FIG. 8B, part of the collector interconnection 13 is spatially separated from a substrate 25 with a space 21. That is, the part of the collector interconnection 13 is not held by the substrate 25. It is preferable to make the space 21 as small as possible so that the collector interconnection 13 can have an appropriate strength. Accordingly, the emitter interconnection 11 is preferably formed to be narrow and thin. However, such a narrow and thin emitter interconnection 11 may increase the parasitic resistance. Moreover, in the air-bridge structure, the interconnections are likely to be short-circuited because of a small load from the surface of the substrate. In addition, the production process for the air-bridge structure is complicated. Therefore, the production cost is increased, and the reliability of the device is decreased.

In a semiconductor device including a plurality of transistors in one and the same substrate, the heat generation during the operation also causes a problem. A GaAs semiconductor has a larger band-gap than that of an Si semiconductor by about 0.3 eV, so that a vertical type construction transistor which uses the GaAs semiconductor should operate at a higher voltage. Thus, the power consumption increases. The increase in power consumption leads to an increase in heat generation. The heat conductivity of the GaAs semiconductor is 0.46 W/° cm C. which is about ⅓ as compared with that of the Si semiconductor. Accordingly, it is important for the vertical type construction transistor to efficiently dissipate the heat generated by the device operation. In a conventional vertical type construction transistor, a device called a plated heat sink (PHS) is used. In this method, a semiconductor substrate is ground to have a thickness of about 20 μm, and a metal with good heat conductivity such as gold is formed on a rear face of the substrate. As a result, the heat is dissipated from the rear face of the semiconductor substrate.

This method includes production process steps for the rear face of the substrate, so that the entire production process is complicated. Especially, the registration for the front face and the rear face of the substrate is complicated and difficult. Moreover, the substrate is made thinner, so that the possibility that the substrate is damaged is increased. Thus, the production cost is increased. Also the formation of gold on the rear face of the substrate causes such problems as the residual stress and the increase in production cost.

SUMMARY OF THE INVENTION

The semiconductor device of this invention includes: a semiconductor substrate; a plurality of vertical type construction transistors, each of the transistors including: a semiconductor multilayer formed on the semiconductor substrate, the semiconductor multilayer including at least an emitter layer, a collector layer, and a base layer; first, second, and third electrodes, the first electrode being electrically connected to the base layer, the second electrode being electrically connected to one of the emitter layer and the collector layer, the third electrode being formed on the semiconductor multilayer, and being electrically connected to the other of the emitter layer and the collector layer; a first interconnection, formed on the semiconductor substrate, for electrically connecting a plurality of the first electrodes to each other; a second interconnection, formed on the semiconductor substrate in a non-intersecting relationship with the first interconnection, for electrically connecting a plurality of the second electrodes to each other; and a plurality of bump electrodes configured to receive a third interconnection for electrically connecting the plurality of bump electrodes to each other, each of the plurality of bump electrodes being formed on a respective one of the third electrodes.

According to the present invention, in a semiconductor device in which a plurality of vertical type construction transistors are formed in one and the same substrate, each transistor has a bump electrode on an emitter electrode or a collector electrode for the connection to a wiring board by flip chip bonding. Accordingly, intersecting portions of interconnections are eliminated, and increases in a parasitic capacitance and a parasitic resistance can be prevented. In addition, the heat generated in the vertical type construction transistor can efficiently be dissipated to the wiring board via the bump electrode.

Thus, the invention described herein makes possible the advantage of providing a semiconductor device including a plurality of vertical type construction transistors in one and the same substrate with an efficient heat dissipation structure, for preventing increases in parasitic capacitance and parasitic resistance caused by the intersection of interconnections.

This and other advantages of the present invention will become apparent to those skilled in the art upon reading and understanding the following detailed description with reference to the accompanying figures.

Description of the Preferred Embodiments

EXAMPLE 1

A vertical type construction transistor used in a semiconductor device according to the invention will be described.

Figure 1A:
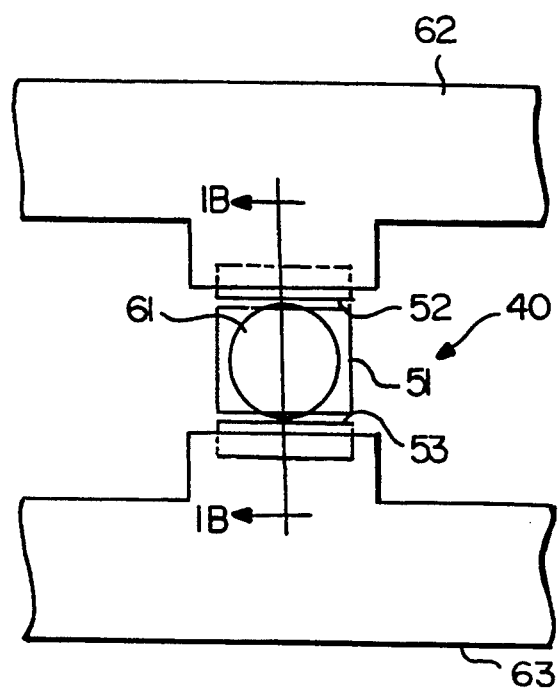
FIG. 1A is a plan view of a vertical type construction transistor of a one-side electrode type used in a semiconductor device according to the invention.
Figure 1B:
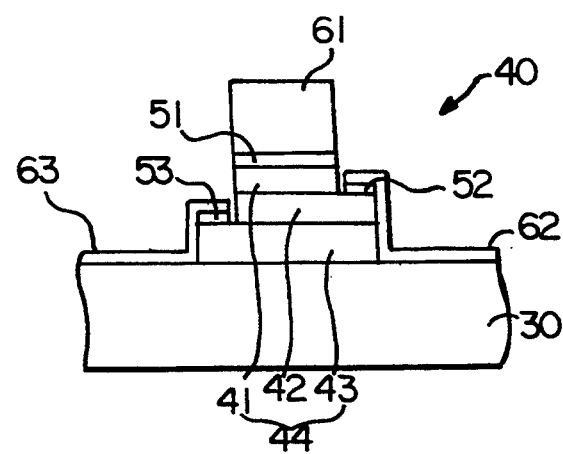
FIG. 1B is a cross-sectional view of the vertical type construction transistor shown in FIG. 1A taken along a line 1B—1B.
Figure 2A:
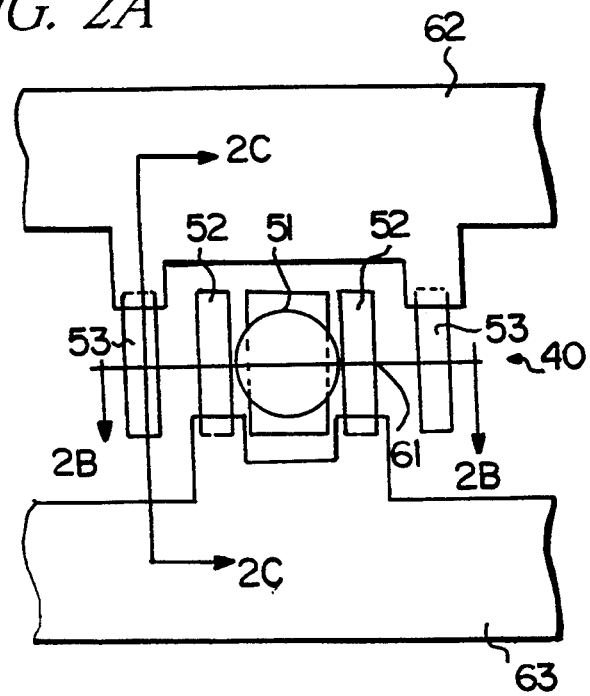
FIG. 2A is a plan view of a vertical type construction transistor of a both-side electrode type used in a semiconductor device according to the invention.
Figure 2B:
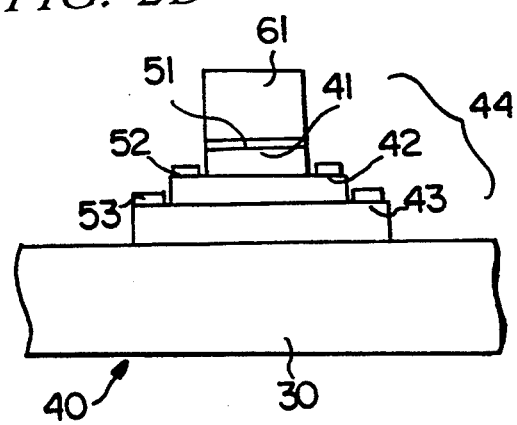
FIG. 2B is a cross-sectional view of the vertical type construction transistor shown in FIG. 2A taken along a line 2B—2B.
Figure 2C:
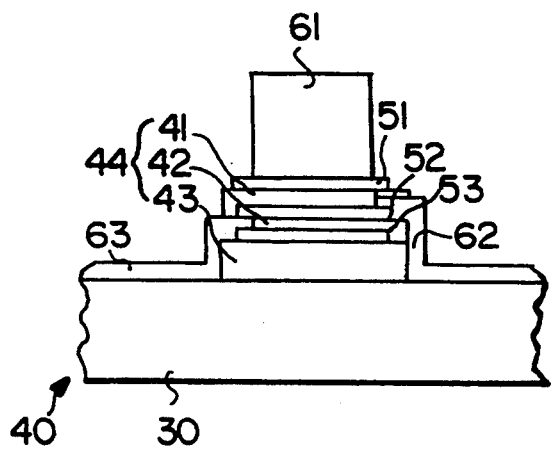
FIG. 2C is a cross-sectional view of the vertical type construction transistor shown in FIG. 2A taken along a line 2C—2C.

A vertical type construction transistor has a one-side electrode type structure shown in FIGS. 1A and 1B, or a both-side electrode type structure shown in FIGS. 2A to 2C. FIGS. 1A and 2A are plan views showing a vertical type construction transistor 40. FIGS. 1B, 2B, and 2C are cross-sectional views showing the vertical type construction transistor 40 taken along lines 1B—1B, 2B—2B, and 2C—2C, respectively.

First, by referring to FIGS. 1A and 1B, the vertical type construction transistor 40 having the one-side electrode type structure will be described. On a semiconductor substrate 30, a semiconductor multilayer 44 is formed. The semiconductor multilayer 44 includes a collector layer 43 formed on the semiconductor substrate 30, a base layer 42 formed on the collector layer 43, and an emitter layer 41 formed on the base layer 42.

On the base layer 42, a base electrode 52 is formed as a first electrode. The base layer 42 and the base electrode 52 are electrically connected to each other. On the collector layer 43, a collector electrode 53 is formed as a second electrode. The collector layer 43 and the collector electrode 53 are electrically connected to each other. The emitter layer 41 is the uppermost layer of the semiconductor multilayer 44. On the semiconductor multilayer 44, an emitter electrode 51 is formed. The emitter layer 41 and the emitter electrode 51 are electrically connected to each other.

A bump electrode 61 is formed on and electrically connected to the emitter electrode 51. A base interconnection 62 and a collector interconnection 63 are formed on the semiconductor substrate 30 as a first interconnection and a second interconnection, respectively. Parts of the base interconnection 62 and the collector interconnection 63 overlap the base electrode 52 and the collector electrode 53, respectively, so as to be electrically connected thereto.

The vertical type construction transistor 40 of the both-side electrode type structure shown in FIGS. 2A to 2C has substantially the same structure as that of the vertical type construction transistor 40 shown in FIGS. 1A and 1B, except that the transistor 40 shown in FIGS.

2A to 2C has two base electrodes 52 and two collector electrodes 53.

Hereinafter, a production process of the vertical type construction transistor 40 having the one-side electrode type structure will be described. By this production process, the vertical type construction transistor 40 having the both-side electrode type structure is also produced. On a semiconductor substrate 30 of semi-insulating GaAs, a semiconductor multilayer 44 is formed by molecular beam epitaxy (MBE), chemical vapor deposition (CVD), or the like. The semiconductor multilayer 44 is formed in such a manner that a collector layer 43 is first deposited on the semiconductor substrate 30, and then a base layer 42 and an emitter layer 41 are successively formed thereon.

The emitter layer 41 is an n-type $Al_xGa_{1-x}As$ layer, for example, having a thickness of about 0.14 $\mu$m, in which x is 0.3 and into which $1 \times 10^{18}$ cm$^{-3}$ of silicon is doped. The base layer 42 is a p-type GaAs layer, for example, having a thickness of about 0.08 $\mu$m into which $1 \times 10^{18}$ cm$^{-3}$ of carbon is doped. The collector layer 43 is an n-type GaAs layer, for example, having a thickness of 0.7 $\mu$m into which $1 \times 10^{18}$ cm$^{-3}$ of silicon is doped.

The semiconductor multilayer 44 may include any other semiconductor layers in addition to the above-mentioned emitter layer 41, base layer 42 and collector layer 43. For example, a contact layer for forming a non-alloy ohmic contact, or a buffer layer for reducing leakage current may be formed. Specifically, an n-type GaAs layer may be interposed between the collector layer 43 and the semiconductor substrate 30 as a buffer layer. Alternatively, an n-type GaAs layer or an n-type InGaAs layer may be formed on the emitter layer 41. In cases where such a semiconductor layer is formed on the emitter layer 41, the semiconductor layer is the uppermost layer of the semiconductor multilayer 44. Thus, an emitter electrode 51 is provided on the semiconductor layer, and the emitter electrode 51 and the emitter layer 41 are electrically connected to each other via the semiconductor layer.

After forming the emitter layer 41, base layer 42, and collector layer 43 into a mesa shape by chemical etching, an emitter electrode 51, a base electrode 52, and a collector electrode 53 are formed on the emitter layer 41, the base layer 42, and the collector layer 43, respectively, so as to form an ohmic contact. As a material of the emitter electrode 51 and the collector electrode 53 which are formed on the n-type semiconductor layers, a multi-layer metal film of AuGe/Ni/Au is used. As a material for the base electrode 52 which is formed on the p-type semiconductor layer, a multi-layer metal film of Ti/Au or Pt/Au is used.

Figure 3A:
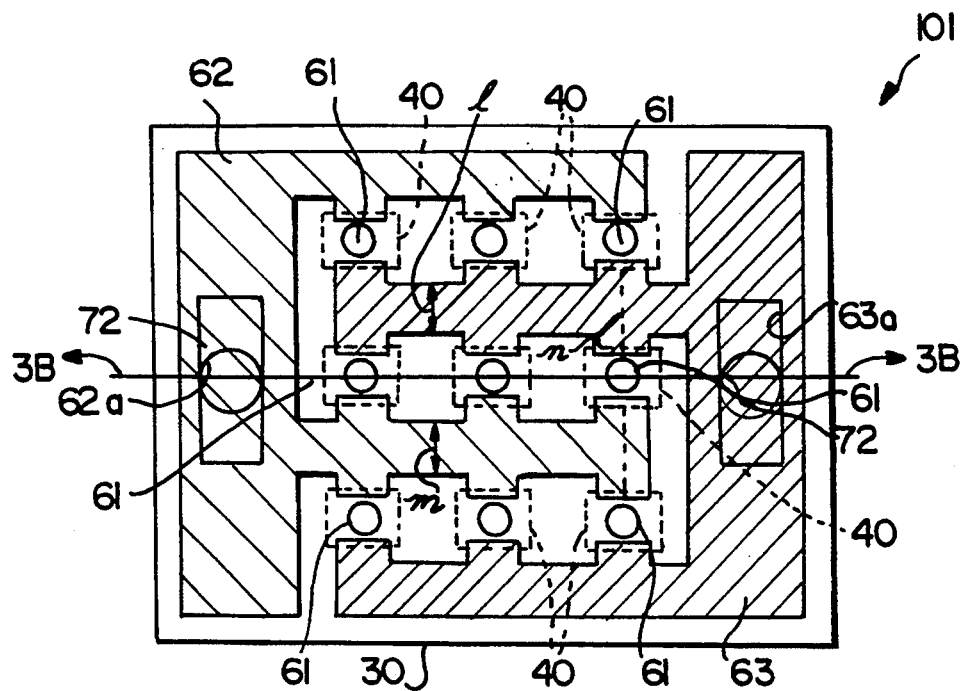
FIG. 3A is a plan view of a semiconductor device of a first example according to the invention.
Figure 3B:
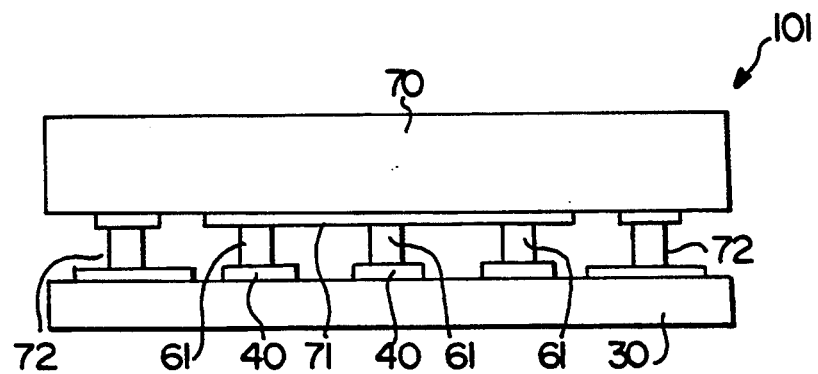
FIG. 3B is a cross-sectional view of the semiconductor device of the first example according to the invention shown in FIG. 3A taken along a line 3A—3A.

Next, a semiconductor device 101 of a first example according to the invention will be described. FIG. 3A is a plan view of the semiconductor device 101 of the first example. FIG. 3B shows a cross section of the semiconductor device 101 taken along a line 3B—3B. A plurality of vertical type construction transistors 40 which are described above are formed on a semiconductor substrate 30 in a matrix form.

In order to connect the base electrodes 52 of the respective vertical type construction transistors 40 (see FIGS. 1A to 3B) to each other in parallel, a collector interconnection 63 is formed on the semiconductor substrate 30. A base interconnection 62 and the collector interconnection 63 are formed of a multilayer metal film of Ti/Pt/Au. As is shown in FIG. 3A, the base interconnection 62 and the collector interconnection 63 are formed on the semiconductor substrate 30 in a non-intersecting relationship. In this specification, non-intersecting relationship means that two interconnections formed on the same support do not cross with each other. Contact holes 62a and 63a are formed for electrically connecting the base interconnection 62 and the collector interconnection 63 with external terminals, respectively.

On the emitter electrode 51 of each of the vertical type construction transistors 40 (see FIGS. 1A to 3B), a bump electrode 61 is formed. As a material of the bump electrode 61, gold, copper, nickel, solder or a combination thereof can be used. It is preferable to use gold which is superior in heat conductivity and workability. As is shown in FIG. 3B, the bump electrode 61 is electrically connected to an emitter interconnection 71 which is formed on the surface of a wiring board 70 as a third interconnection. For clearly showing other elements, the wiring board 70 and the emitter interconnection 71 which are shown in FIG. 3B are not shown in FIG. 3A. The emitter interconnection 71 and the bump electrode 61 are connected by flip chip bonding. The emitter interconnection 71 may electrically connect all or some of the bump electrodes 61 to each other depending on the application. For this connection, the wiring board 70 is put in a state where it faces the semiconductor substrate 30 in such a manner that the emitter interconnection 71 formed on the surface of the wiring board 70 is in contact with the bump electrodes 61. In this state, the wiring board 70 and the semiconductor substrate 30 are pressed to each other at a predetermined pressure with a flip chip bonder. The wiring board 70 is preferably formed, for example, of a material which is superior in heat dissipation and insulation such as aluminum nitride.

In another case, additional bump electrodes 72 may be formed on the contact holes 62a and 63a, so as to dissipate the heat accumulated in the base interconnection 62 and the collector interconnection 63 to the wiring board 70 via the bump electrodes 72.

The base interconnection 62 and the collector interconnection 63 are formed on the semiconductor substrate 30, while the emitter interconnection 71 is formed on the surface of the wiring board 70 opposed to the semiconductor substrate 30. Each emitter electrode 51 is connected to the emitter interconnection 71 through the respective bump electrode 61 formed thereon. Therefore, with no intersection of the interconnections, the plurality of vertical type construction transistors 40 can be connected to each other, whereby increases in parasitic capacitance and parasitic resistance caused by the intersection of the interconnections can be prevented. In addition, as is shown in FIG. 3A, depending on the arrangement of the vertical type construction transistors 40, the width m of the base interconnection 62, the width l of the collector interconnection 63 or the width (not shown) of the emitter interconnection 71 can be made larger, whereby the parasitic resistance on each interconnection can be sufficiently reduced. The heat generated at the junction between the emitter layer 41 and the base layer 42 of each vertical type construction transistor 40 is efficiently dissipated via the bump electrode 61 formed of a material having high heat conductivity, and via the emitter interconnection 71 and the wiring board 70. Accordingly, the generated heat is not accumulated in the semiconductor device 101. Since the bump electrode 61 is provided close to the junction, and formed of gold having high heat conductivity, the heat dissipation can be more efficient than in the case where the heat is dissipated via a semiconductor substrate having low heat conductivity by a conventional PHS method. Moreover, since it is unnecessary to reduce the thickness of the semiconductor substrate, the semiconductor device can readily be produced at a reduced cost as compared with the case of the PHS method.

Figure 3C:
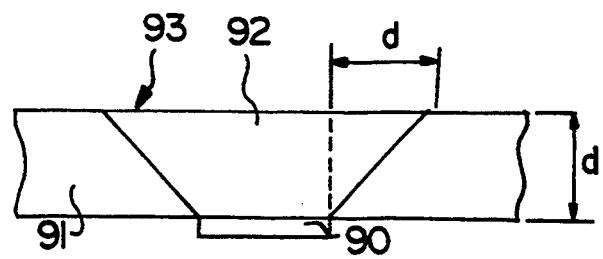
FIG. 3C illustrates a relationship between a heat source and a heat conducting path.

FIG. 3C shows an example in which a heat dissipating plate 91 having a thickness d is connected to a heat source 90. If the heat is sufficiently dissipated from a surface 93 of the heat dissipating plate 91, the heat is conducted approximately at an angle of 45° with respect to the heat source 90. As a result, a heat conducting path 92 is formed. It is considered that, if the heat sources 90 are formed at an interval of 2d or more, the respective heat conducting paths 92 do not overlap each other, whereby the maximum heat dissipation effect can be attained. Therefore, if the vertical type construction transistors 40 are formed at an interval equal to or more than twice the thickness of the wiring board 70 which serves as a heat dissipating plate, the heat dissipation will be sufficiently attained.

In general, in order to maintain the predetermined strength of the wiring board 70, the wiring board 70 preferably has a thickness of 0.4 mm or more. Accordingly, it is preferable to set the interval n shown in FIG. 3A to be 0.8 mm or more. However, in view of the requirement that the size of the semiconductor device itself should be equal to or smaller than half of the wavelength of the operating frequency, and the merit of integrating the vertical type construction transistors 40, it is not practical to form the vertical type construction transistors 40 at an interval of 0.8 mm.

Figure 3D:
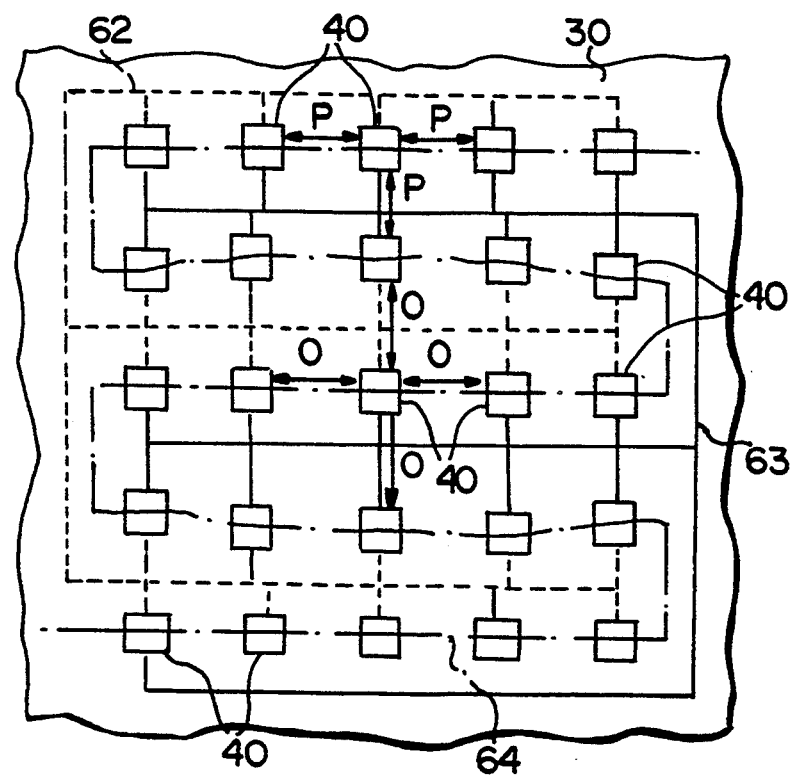
FIG. 3D is a plan view for illustrating the arrangement of vertical type construction transistors in the semiconductor device of the first example according to the invention.

In the semiconductor device 101, if a plurality of vertical type construction transistors 40 are arranged at a regular interval in a matrix form on the semiconductor substrate 30, the generated heat is likely to be accumulated in the center portion of the semiconductor device 101. Thus, there arises a problem in that the vertical type construction transistors 40 provided in the center portion may easily be deteriorated in the early stages. As is shown in FIG. 3D, in order to solve this problem, it is preferable to make the interval between the vertical type construction transistors 40 larger toward the center of the matrix of the plurality of vertical type construction transistors 40 in the semiconductor device 101. By making the arranged interval o between the vertical type construction transistors 40 in the center portion larger than the arranged interval p between the vertical type construction transistors 40 in the peripheral portion, the center portion of the semiconductor device 101 is prevented from being heated to a considerably high temperature.

EXAMPLE 2

Figure 4:
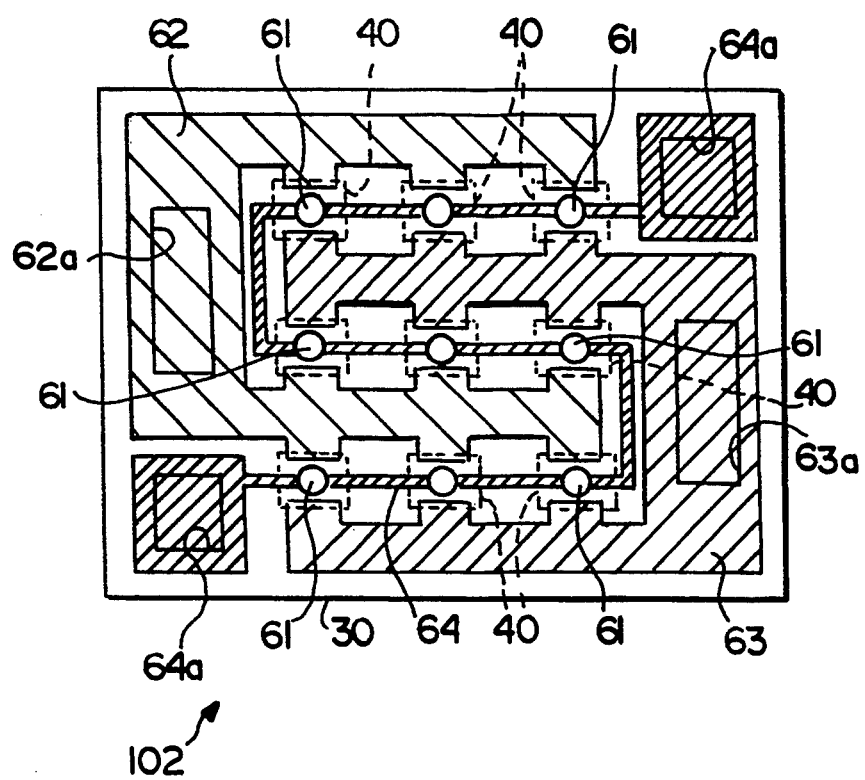
FIG. 4 is a plan view of a semiconductor device of a second example according to the invention.

FIG. 4 is a plan view of a semiconductor device 102 of a second example according to the invention. In FIG. 4, the same components have the same reference numerals as in the semiconductor device 101 of the first example. The structure of the semiconductor device 102 is substantially different from that of the semiconductor device 101 in that the semiconductor device 102 includes an emitter monitor interconnection 64. The structural elements other than the emitter monitor interconnection 64 are substantially the same as those of the semiconductor device 101 shown in FIGS. 3A and 3B, and the descriptions thereof are omitted. For clearly showing the structure, the wiring board 70 and the emitter interconnection 71 shown in FIG. 3B are not shown in FIG. 4. The emitter monitor interconnection 64 is formed on the semiconductor substrate 30 in such a manner that the emitter monitor interconnection 64 runs between the base interconnection 62 and the collector interconnection 63. The emitter monitor interconnection 64 connects the bump electrodes 61 of the respective vertical type construction transistors 40 to each other in parallel. At both ends of the emitter monitor interconnection 64, contact holes 64a are formed so that the emitter monitor interconnection 64 is electrically connected to the outside of the semiconductor device 102.

Due to the provision of the emitter monitor interconnection 64, the characteristics of the semiconductor device 102 can be evaluated before the emitter interconnection 71 (not shown) provided on the wiring board 70 is connected to the bump electrodes 61. In other words, before the wiring board 70 is connected to the bump electrodes 61, the characteristics of the semiconductor device 102 can be evaluated. Therefore, it is possible to discard defective devices during the production process, and hence the production cost can be reduced.

The formation of the emitter monitor interconnection 64 enables the semiconductor device 102 to operate. The emitter monitor interconnection 64 has a narrow width and a high resistance due to the presence of the base interconnection 62 and the collector interconnection 63. In the case of no emitter interconnection 71 (not shown), the emitter resistance increases and the high frequency characteristic of the semiconductor device 102 is degraded. Therefore, it is preferable to use the emitter monitor interconnection 64 only for the purpose of the evaluation of the characteristics.

The emitter layers 41 (not shown) of the vertical type construction transistors 40 are electrically connected to each other by the emitter monitor interconnection 64, so that the vertical type construction transistors 40 in which the bump electrodes 61 are not yet connected to the emitter interconnection 71 (not shown) can operate. However, the vertical type construction transistors 40 in such a state cannot dissipate the heat generated during the operation to the wiring board 70 (not shown) via the bump electrodes 61. Such vertical type construction transistors 40 adversely effect the whole semiconductor device 102.

Accordingly, it is preferable in normal operation that current is not allowed to substantially flow through the emitter monitor interconnection 64 or that the emitter monitor interconnection 64 is disconnected. For example, by forming the emitter monitor interconnection 64 using a material with a high resistance of 100 ohms–100 kilohms, it is possible to cause substantially no current to flow through the emitter monitor interconnection 64 during the operation. Specifically, tungsten or the like can be used as such a material. Alternatively, the emitter monitor interconnection 64 may be formed of a material having a low melting point, and the emitter monitor interconnection 64 may be fused and disconnected after the evaluation of the characteristics. Preferably, such a material having a low melting point has a melting point of 100° C. or more in order not to fuse during the semiconductor production process, and the material may be fused at temperatures of 400° C. or less at which the semiconductor device 102 is not deteriorated. Specifically, a nickel-chrome alloy or an indium solder can be used as the material having a low melting point. Alternatively, the emitter monitor interconnection 64 may be disconnected with a laser trimmer or ion beams after the evaluation of the characteristics. In this case, the emitter monitor interconnection 64 can be made of a multi-layer metal film of Ti/Pt/Au, the same as the base interconnection 62 and the collector interconnection 63.

EXAMPLE 3

Figure 5A:
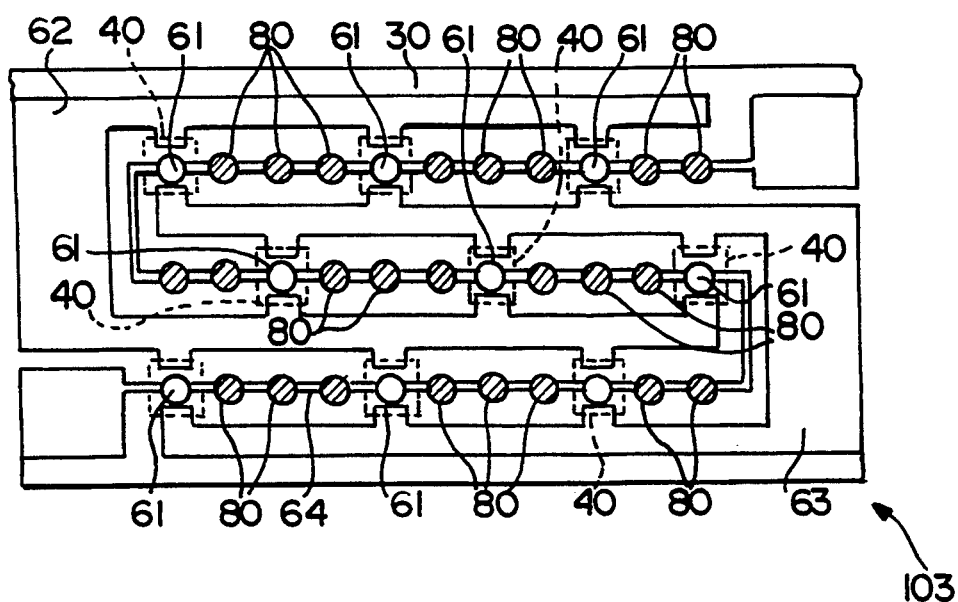
FIG. 5A is a plan view of a semiconductor device of a third example according to the invention.
Figure 5B:
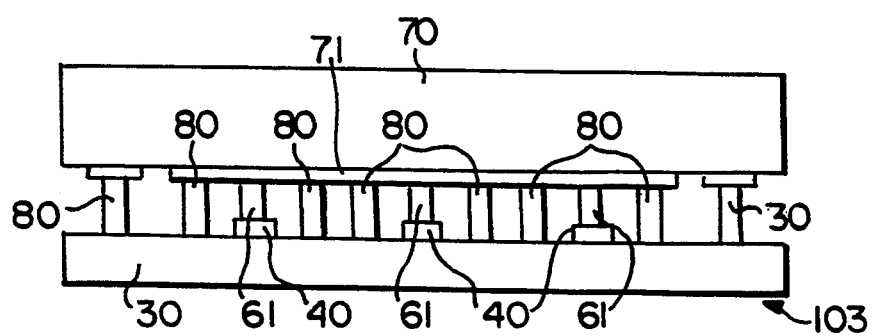
FIG. 5B is a cross-sectional view of the semiconductor device of the third example according to the invention.

FIG. 5A is a plan view of a semiconductor device 103 of a third example according to the invention. FIG. 5B is a cross sectional view of the semiconductor device 103. The same components have the same reference numerals as in the semiconductor device 102 of the second example. The structure of the semiconductor device 103 is substantially different from that of the semiconductor device 102 in that the semiconductor device 103 includes dummy bumps 80. The structural elements other than the dummy bumps 80 are substantially the same as those in the semiconductor device 102 shown in FIG. 4, and the descriptions thereof are omitted.

As is shown in FIG. 5A, the dummy bumps 80 are formed on the emitter monitor interconnection 64. The dummy bumps 80 are connected to the emitter interconnection 71 by flip chip bonding. For clearly showing the elements, the wiring board 70 and the emitter interconnection 71 shown in FIG. 5B are not shown in FIG. 5A.

In FIG. 5A, each dummy bump 80 is formed on the emitter monitor interconnection 64. Alternatively, each dummy bump 80 may be provided at any position other than on the emitter monitor interconnection 64. The dummy bumps 80 can be provided in the semiconductor device 101 of the first example, i.e., in a semiconductor device with no emitter monitor interconnection 64.

The dummy bumps 80 serve as auxiliary columns when the emitter interconnection 71 formed on the wiring board 70 is connected to the bump electrodes 61 by flip chip bonding which is described below.

In the vertical type construction transistor 40, the emitter layer 41 preferably has a smaller area in order to reduce the emitter-base parasitic capacitance. Therefore, the diameter of each of the bump electrodes 61 formed on the emitter electrode 51 is about several tens of micrometers.

In general, flip chip bonding of a bump is preformed at a pressure of 1–15 kg/mm$^2$. If a semi-conductor device including ten vertical type construction transistors 40, it is necessary to apply a pressure of about 4–60 g. However, it is difficult for a usual flip chip bonder to regulate such a small pressure.

By the provision of the dummy bumps 80, the number of bumps formed in the semiconductor device 103 is increased and the load during the flip chip bonding can be increased to a level which can be regulate by the flip chip bonder. Therefore, a stable flip chip connection can be realized.

Figure 5C:
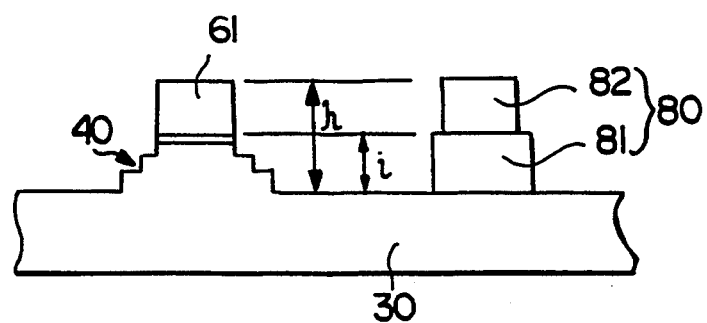
FIGS. 5C and 5D are cross-sectional views for illustrating the structure of a dummy bump used in the semiconductor device of the third example.

As is shown in FIG. 5C, preferably, each of the dummy bumps 80 and each of the dump electrodes 61 have substantially the same height h measured from the semiconductor substrate 30. When the bump electrode 61 is higher than the dummy bump 80, a considerable load is applied to the bump electrode 61, so that the vertical type construction transistor 40 may be damaged. For this reason, the dummy bump 80 preferably includes a base portion 81 and a column portion 82. By using such a structure, the height of a dummy bump 80 can easily be made substantially equal to that of the bump electrode 61.

Figure 5D:
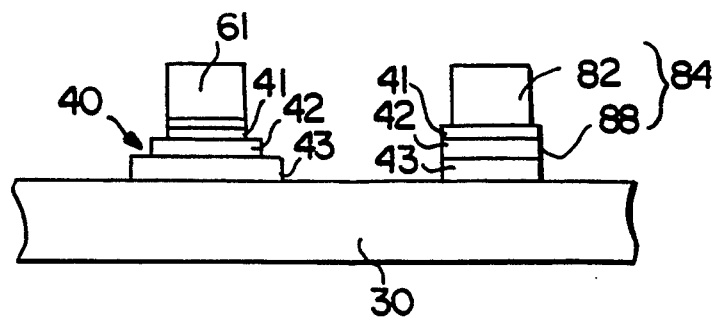
Figure 6:
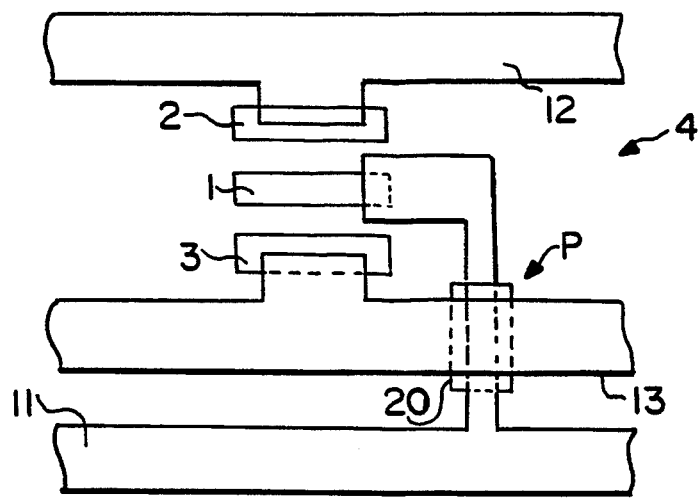
FIG. 6 is a plan view showing a conventional interconnection method in a vertical type construction transistor.
Figure 7A:
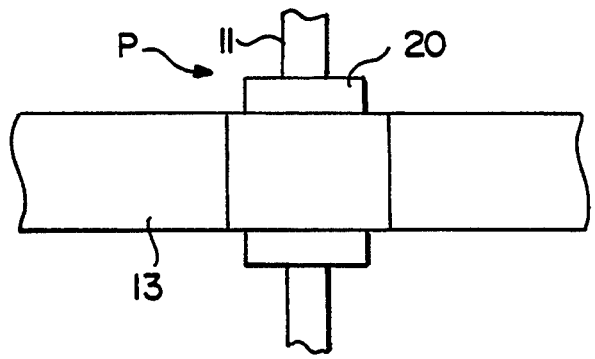
FIG. 7A is an enlarged plan view of the interconnection intersecting portion shown in FIG. 6.
Figure 7B:
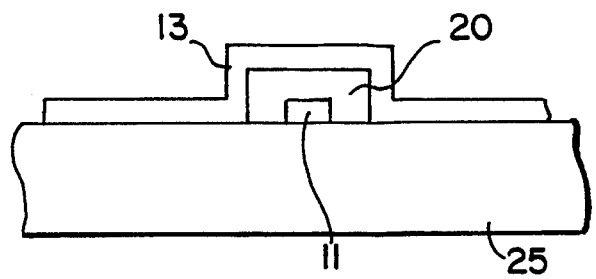
FIG. 7B is an enlarged cross-sectional view of the interconnection intersecting portion shown in FIG. 6.
Figure 8A:
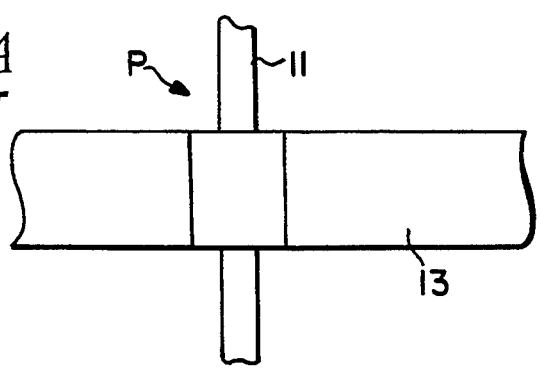
FIG. 8A is a plan view showing an interconnection intersecting portion with an air-bridge structure in a conventional semiconductor device.
Figure 8B:
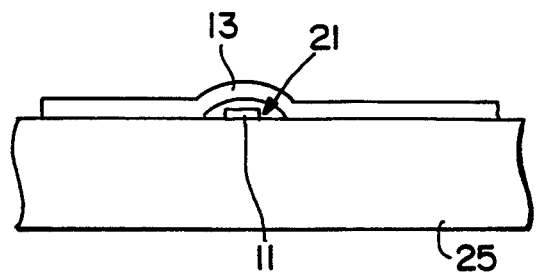
FIG. 8B is a cross-sectional view showing the interconnection intersecting portion with the air-bridge structure in the conventional semiconductor device.

With reference to FIG. 5C, the formation process of a dummy bump 80 having the same height as that of the bump electrode 61 is described. After a vertical type construction transistor 40 is formed, a base portion 81 having a height i equal to that of the vertical type construction transistor 40 is formed on the semiconductor substrate 30 by plating or deposition. Thereafter, the bump electrode 61 and a column portion 82 are simultaneously formed by plating. In FIG. 5C, the base portion 81 is formed on the semiconductor substrate 30. Alternatively, the base portion 81 may be formed on the emitter monitor interconnection 64. In another method, as is shown in FIG. 5D, during the formation of the vertical type construction transistor 40, parts of the emitter layer 41, the base layer 42 and the collector layer 43 are left unetched as a base portion 83, and then the bump electrode 61 and a column portion 82 are simultaneously formed by plating. Thus, a dummy bump 84 composed of the base portion 83 and the column portion 82 is formed.

In Examples 1, 2, and 3, the semiconductor devices 101, 102, and 103 of the present invention have the emitter interconnection 71 connected to the bump electrode 61. As is mentioned above, the bump electrode 61 formed on the emitter electrode 51 prevents the emitter interconnection 71 from coming into direct contact with the collector interconnection 63 and the base interconnection 62. It will be understood that the present invention has utility both as a semiconductor device including the emitter interconnection 71 or a semiconductor device without the emitter interconnection 71. The emitter interconnection can then be added by the end user. As a result, the end user can utilize a custom emitter interconnection in combination with the semiconductor device, the emitter interconnection being customized according to the particular use whereby all or some of the emitter bump electrodes will be interconnected depending on the application.

The semiconductor device according to the invention is to solve the problems common to various vertical type construction transistors. In the above first to third examples, a vertical type construction transistor 40 having a so-called emitter top structure has been described, which includes the collector layer 43 formed on the semiconductor substrate 30, the base layer 42 formed on the collector layer 43, and the emitter layer 41 formed on the base layer 42. However, alternatively, a vertical type construction transistor 40 may have a so-called collector top structure which includes the emitter layer 41 formed on the semiconductor substrate 30, the base layer 42 formed on the emitter layer 41 and the collector layer 43 formed on the base layer 42. In this case, by forming a semiconductor device having a structure in which "emitter" is exchanged for "collector" in the above examples, the above-mentioned effects can be attained. Moreover, the transistor may be either of npn type or of pnp type.

Moreover, regarding the structure of a transistor, a so-called single heterojunction bipolar transistor (SHBT) in which only the emitter layer 41 has a large band gap or a double heterojunction bipolar transistor (DHBT) in which the collector layer 43 as well as the emitter layer 41 has a large band gap can be used. In the above examples, it is sufficient for a transistor to be a vertical type construction transistor. Thus, the transistor may be a hot electron transistor, a resonant tunnel transistor, or the like.

It is easily understood that any practical values other than the specific values used in the above examples can be used.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device comprising:
   a semiconductor substrate;
   a plurality of vertical type transistors, each of said transistors including:
   a semiconductor multilayer formed on said semiconductor substrate, said semiconductor multilayer including at least an emitter layer, a collector layer, and a base layer;
   first, second, and third electrodes, said first electrode being electrically connected to said base layer, said second electrode being electrically connected to one of said emitter layer and said collector layer, said third electrode being formed on said semiconductor multilayer, and being electrically connected to the other of said emitter layer and said collector layer;
   a first interconnection, formed on said semiconductor substrate, for electrically connecting a plurality of said first electrodes to each other;
   a second interconnection, formed on said semiconductor substrate in a non-intersecting relationship with said first interconnection, for electrically connecting a plurality of said second electrodes to each other; and
   a plurality of bump electrodes configured to receive a third interconnection for electrically connecting said plurality of bump electrodes to each other in a non-intersecting relationship with both said first interconnection and said second interconnection, each of said plurality of bump electrodes being formed on a respective one of said third electrodes.

2. A semiconductor device according to claim 1, further comprising said third interconnection electrically connected to said plurality of bump electrodes.

3. A semiconductor device according to claim 2, wherein said third interconnection is electrically connected to said plurality of bump electrodes by flip chip bonding.

4. A semiconductor device according to claim 2, further comprising a wiring board, said third interconnection being formed at a surface of said wiring board.

5. A semiconductor device according to claim 1, further comprising a monitor interconnection provided in a non-intersecting relationship with said first and second interconnection, for connecting said plurality of third electrodes to each other and for checking operation of said plurality of vertical type transistors before connecting said plurality of bump electrodes with said third interconnection.

6. A semiconductor device according to claim 5, wherein said monitor interconnection is made of a material with high resistance of 100 ohms to 100 kilohms.

7. A semiconductor device according to claim 5, wherein said monitor interconnection is made of a material having a melting point in the range of 100° C. to 400° C.

8. A semiconductor device according to claim 1, wherein said plurality of vertical type transistors are arranged in a matrix at an interval which becomes larger toward the center of said matrix.

9. A semiconductor device according to claim 1, further comprising dummy bumps for supporting a wiring board.

10. A semiconductor device according to claim 9, wherein said dummy dumps have the same height as said plurality of bump electrodes.

11. A semiconductor device according to claim 4, wherein said wiring board is made of a material including aluminum nitride.

12. A semiconductor device comprising:
    a semiconductor substrate;
    a plurality of vertical type transistors, each of said transistors including:
    a semiconductor multilayer formed on said semiconductor substrate, said semiconductor multilayer including at least an emitter layer, a collector layer, and a base layer;
    first, second, and third electrodes, said first electrode being electrically connected to said base layer, said second electrode being electrically connected to one of said emitter layer and said collector layer, said third electrode being formed on said semiconductor multilayer, and being electrically connected to the other of said emitter layer and said collector layer;
    a first interconnection supported by said semiconductor substrate, said first interconnection for electrically connecting a plurality of said first electrodes to each other;
    a second interconnection supported by said semiconductor substrate; said second interconnection electrically connecting a plurality of said second electrodes to each other and being in a nonintersecting relationship with said first interconnection, and;
    a plurality of bump electrodes configured to receive a third interconnection for electrically connecting said plurality of bump electrodes to each other in nonintersecting relationships with both said first interconnection and said second interconnection, each of said plurality of bump electrodes being formed on a respective one of said third electrodes and having a top surface which is positioned at a higher level than levels of said first interconnection and said second interconnection.

13. A semiconductor device comprising:
    a semiconductor substrate;
    a plurality of vertical type transistors, each of said transistors including:
    a semiconductor multilayer formed on said semiconductor substrate, said semiconductor substrate, said semiconductor multilayer including at least an emitter layer, a collector layer, and a base layer;
    first, second, and third electrodes, said first electrode being electrically connected to said base layer, said second electrode being electrically connected to one of said emitter layer and said collector layer, said third electrode being formed on said semiconductor multilayer, and being electrically connected to the other of said emitter layer and said collector layer;
    a first interconnection, formed on said semiconductor substrate, for electrically connecting a plurality of said first electrodes to each other, said first interconnection having a digitate shape;

a second interconnection, formed on said semiconductor substrate in a non-intersecting relationship with said first interconnection, for electrically connecting a plurality of said second electrodes to each other, said second interconnection having a digitate shape, said first interconnection and said second interconnection being interdigitated;

a plurality of bump electrodes each formed on a respective one of said third electrodes; and a wiring board having a third interconnection on a surface thereof, said third interconnection electrically connecting said plurality of bump electrodes to each other in a non-intersecting relationship with both said first interconnection and said second interconnection.

* * * * *